US012759016B2

(12) United States Patent
Yoon et al.

(10) Patent No.: US 12,759,016 B2
(45) Date of Patent: Oct. 13, 2026

(54) INTERSTITIALLY MIXED SELF-ASSEMBLED MONOLAYERS AND METHOD OF MANUFACTURING THE SAME BY RESEM

(71) Applicant: KOREA UNIVERSITY RESEARCH AND BUSINESS FOUNDATION, Seoul (KR)

(72) Inventors: Hyo Jae Yoon, Seoul (KR); Gyu don Kong, Seoul (KR); Hyun sun Song, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 649 days.

(21) Appl. No.: 18/113,730

(22) Filed: Feb. 24, 2023

(65) Prior Publication Data

US 2023/0271217 A1 Aug. 31, 2023

(30) Foreign Application Priority Data

Feb. 28, 2022 (KR) ........................ 10-2022-0025869

(51) Int. Cl.
*B05D 1/00* (2006.01)
*B05D 1/18* (2006.01)
(Continued)

(52) U.S. Cl.
CPC .............. *B05D 1/185* (2013.01); *B82Y 30/00* (2013.01); *B82Y 40/00* (2013.01); *H10K 10/701* (2023.02)

(58) Field of Classification Search
CPC ........................................................ B05D 1/00
See application file for complete search history.

(56) References Cited

U.S. PATENT DOCUMENTS

| | | | | |
|---|---|---|---|---|
| 6,114,099 A * | 9/2000 | Liu | B05D 1/185 | 430/324 |
| 2003/0170480 A1* | 9/2003 | Gorman | C07K 7/00 | 428/629 |
| 2007/0140901 A1* | 6/2007 | Buck | B32B 38/0036 | 422/400 |

FOREIGN PATENT DOCUMENTS

KR 10-1788297 B1 10/2017

OTHER PUBLICATIONS

Korean Office Action issued on May 1, 2024, in counterpart Korean Patent Application No. 10-2022-0025869 (6 pages in English, 6 pages in Korean).

(Continued)

*Primary Examiner* — Gordon Baldwin
*Assistant Examiner* — Mohammad Mayy
(74) *Attorney, Agent, or Firm* — NSIP Law

(57) ABSTRACT

Disclosed are an interstitially mixed self-assembled monolayer (ImSAM) that can be manufactured very easily by utilizing a novel method of manufacturing supramolecular alloys called "repeated surface exchange of molecules (ReSEM)", maintain chemical functional groups exposed to the surface of conventional thin films and selectively improve stability without interfering with performance, and a method of manufacturing the same. The interstitially mixed self-assembled monolayers (imSAMs) remarkably enhance electrical stability of molecular-scale electronic devices without deterioration in functions and reliability, withstand a high voltage, and exhibit better stability than a single SAM while maintaining the performance of the prior art, thus being useful for a variety of technical fields using SAMs, especially electronics, organic light-emitting displays (OLEDs), solar cells, sensors, heterogeneous catalysts, frictional electricity, cell growth surfaces, and heat transfer control films.

3 Claims, 13 Drawing Sheets

(51) Int. Cl.
*B82Y 30/00* (2011.01)
*B82Y 40/00* (2011.01)
*H10K 10/00* (2023.01)

(56) References Cited

OTHER PUBLICATIONS

Kong, Gyu Don, et al. “Interstitially mixed self-assembled monolayers enhance electrical stability of molecular junctions.” *Nano Letters* 21.7 (Apr. 2, 2021): pp. 3162-3169.

* cited by examiner

[Fig. 1]
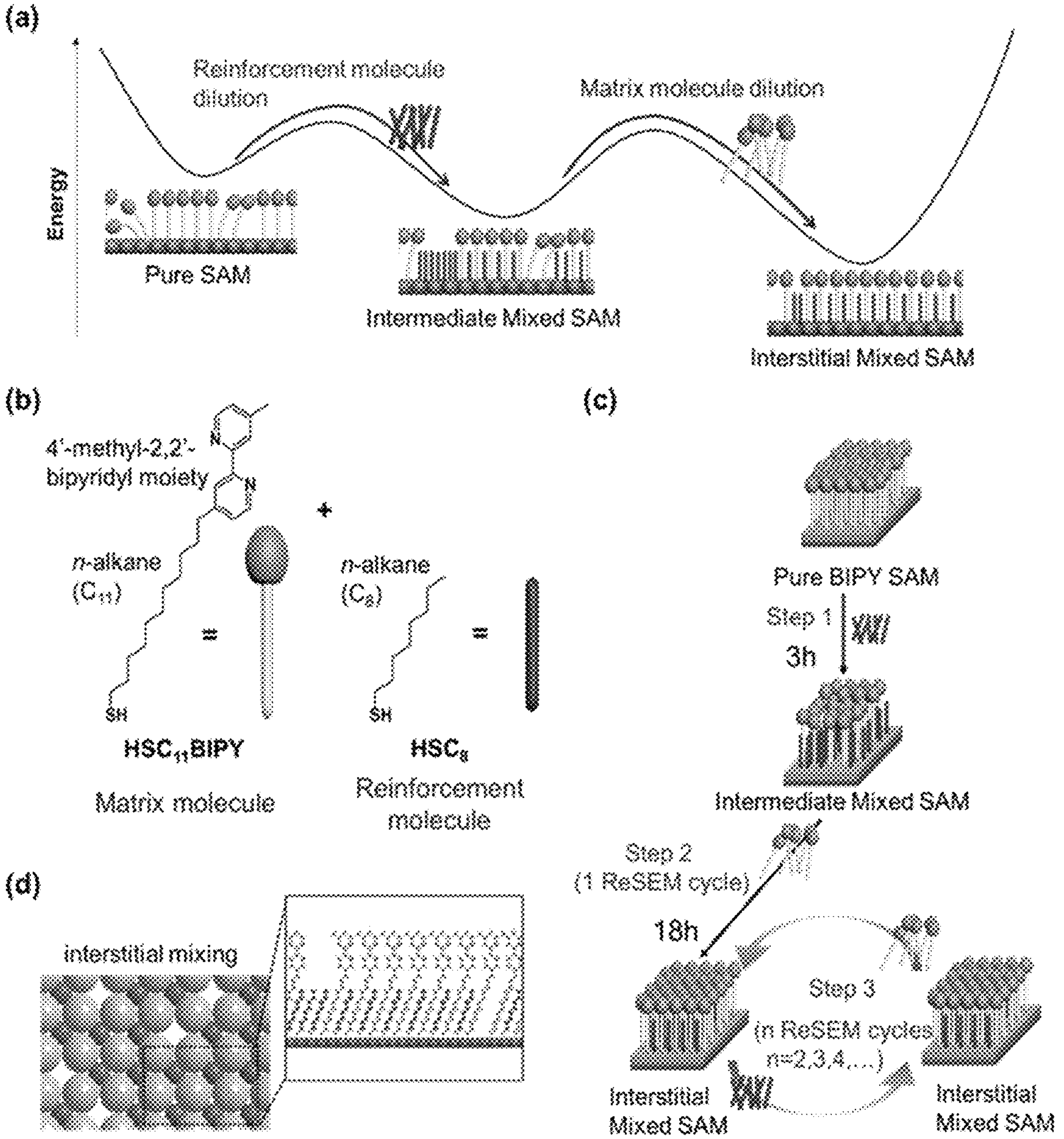

[Fig. 2]
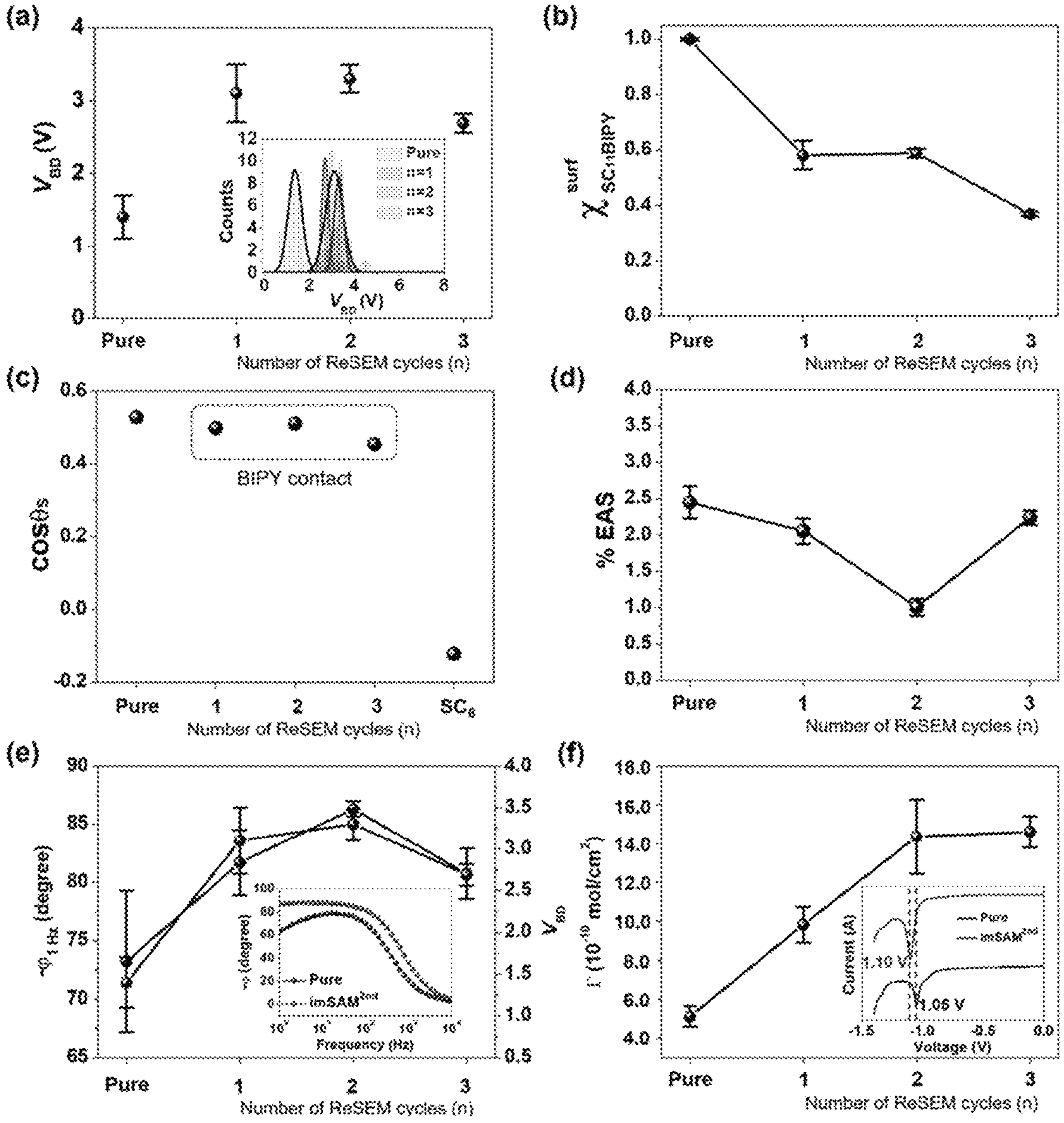

[Fig. 3]
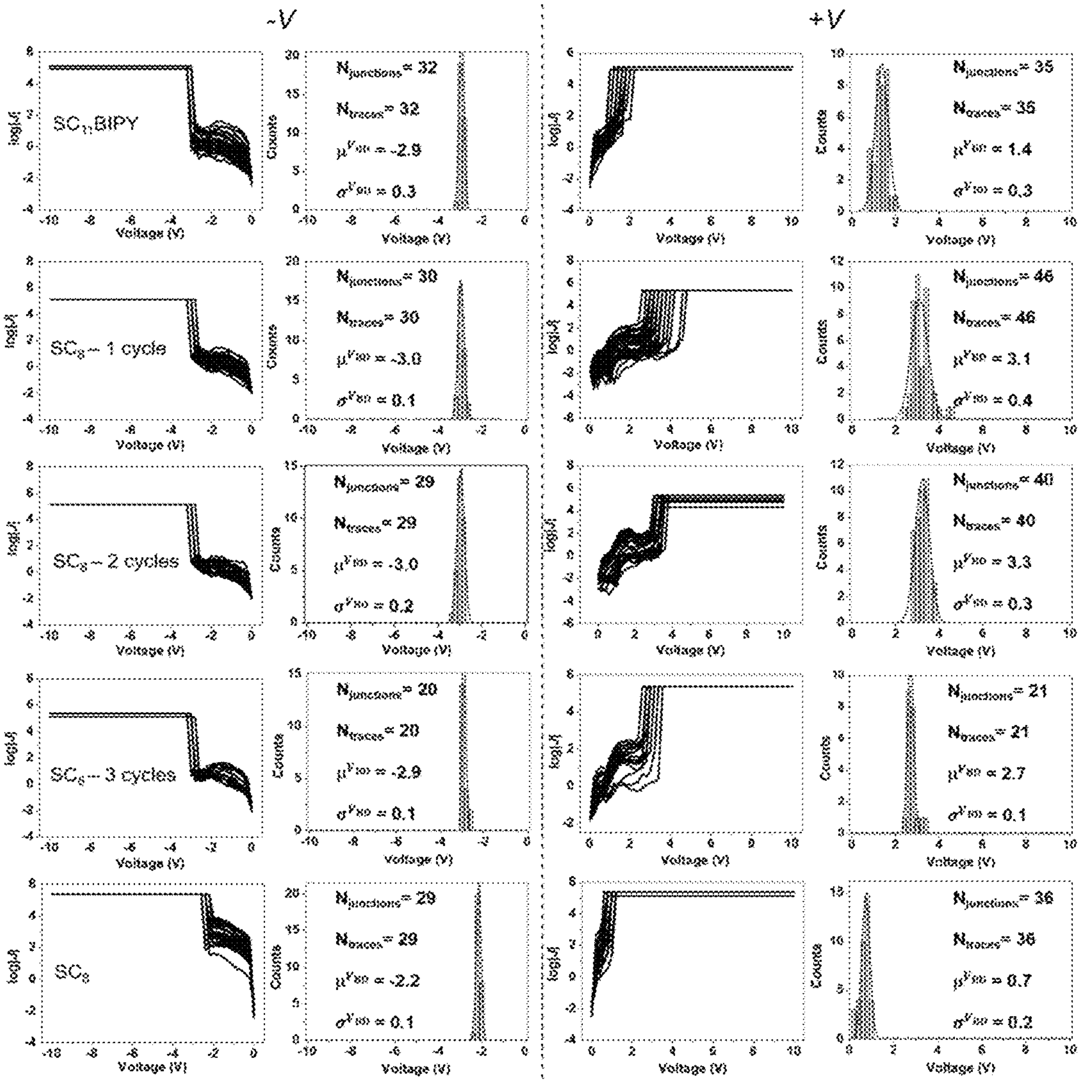

[Fig. 4]
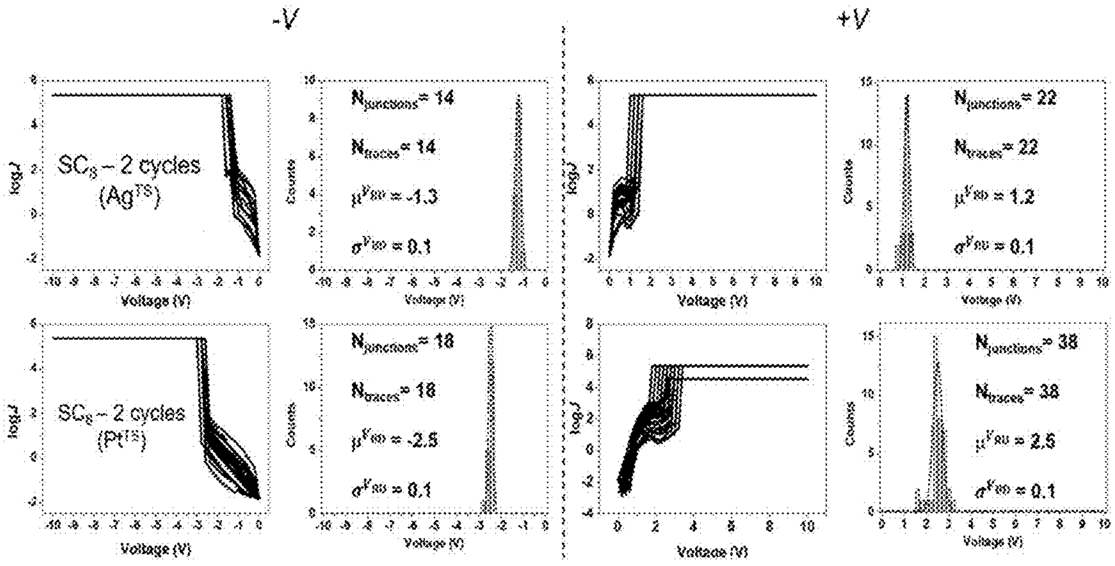
[Fig. 5]
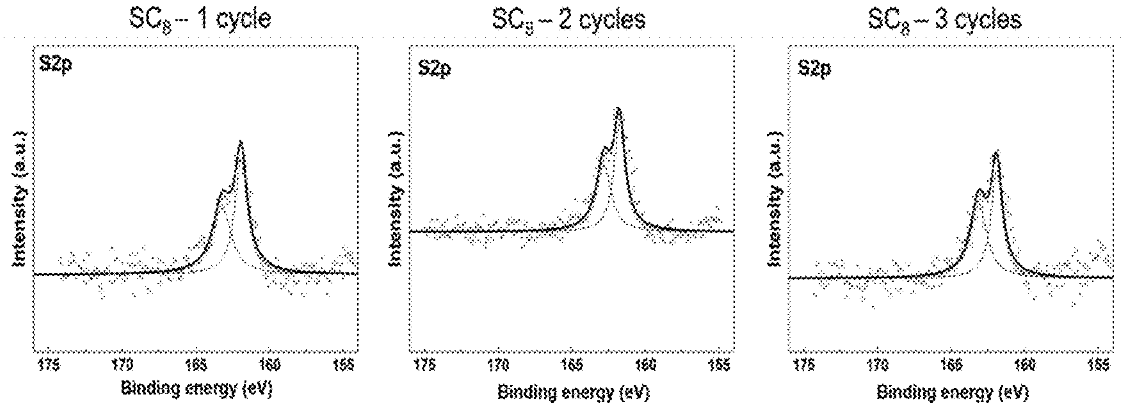

[Fig. 6]
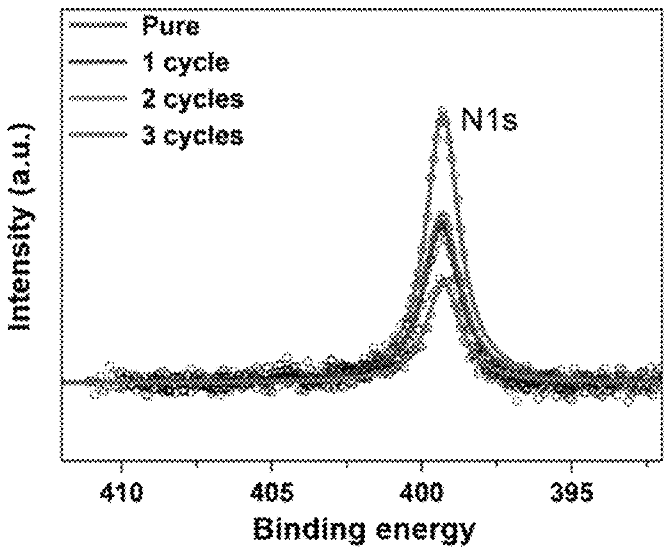
[Fig. 7]
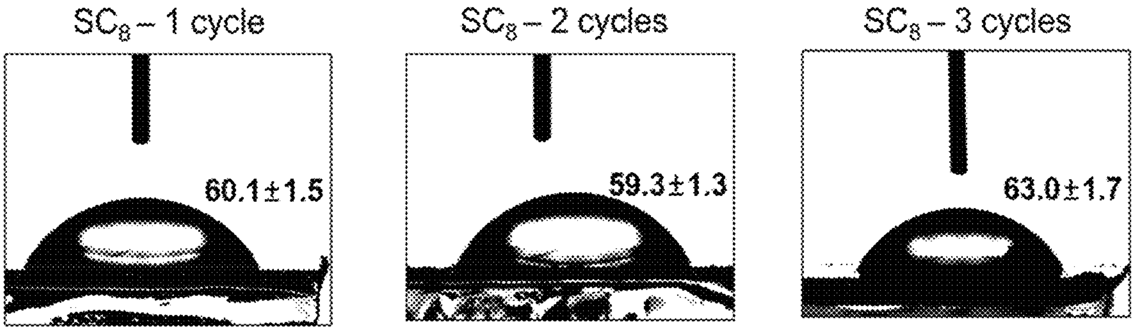

[Fig. 8]
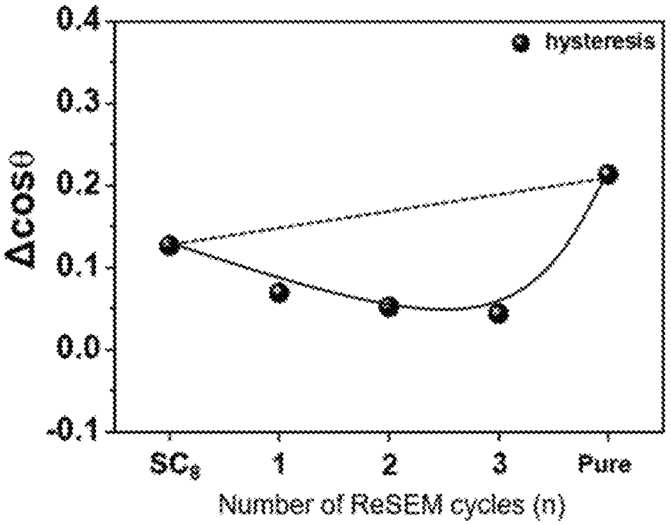

[Fig. 9]
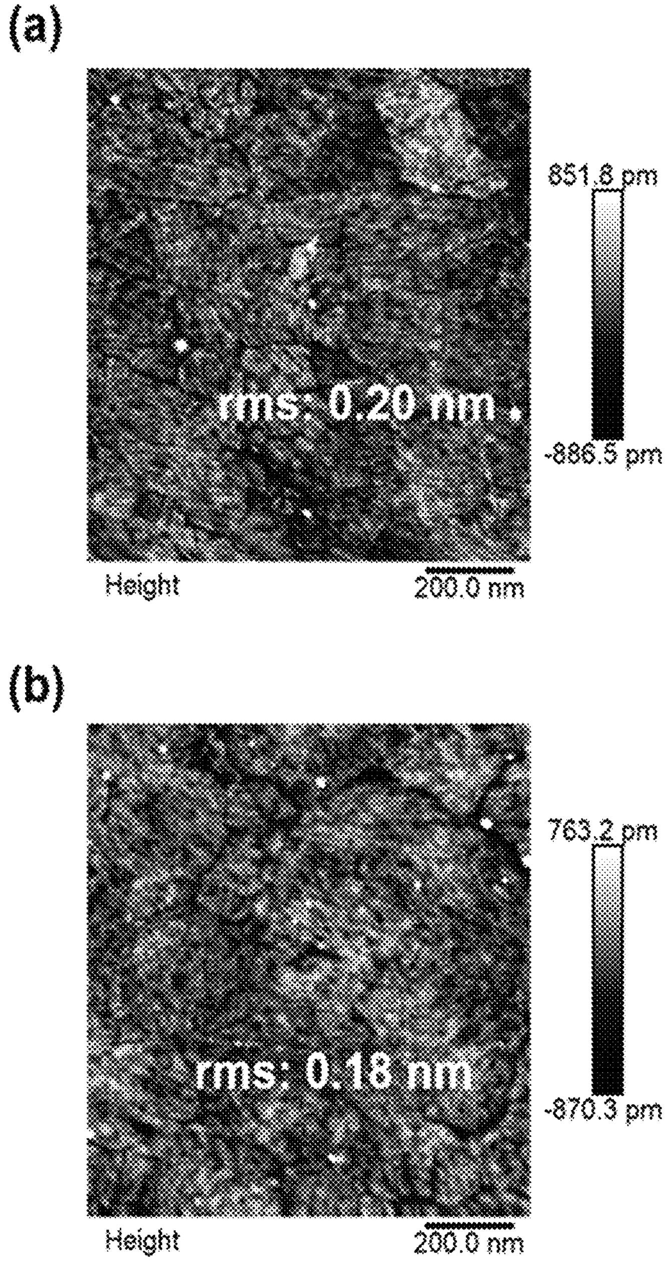

[Fig. 10]
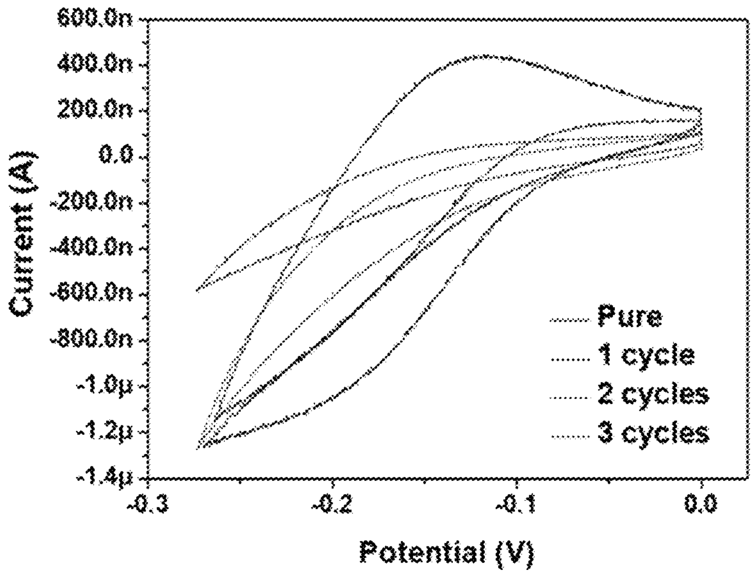
[Fig. 11]
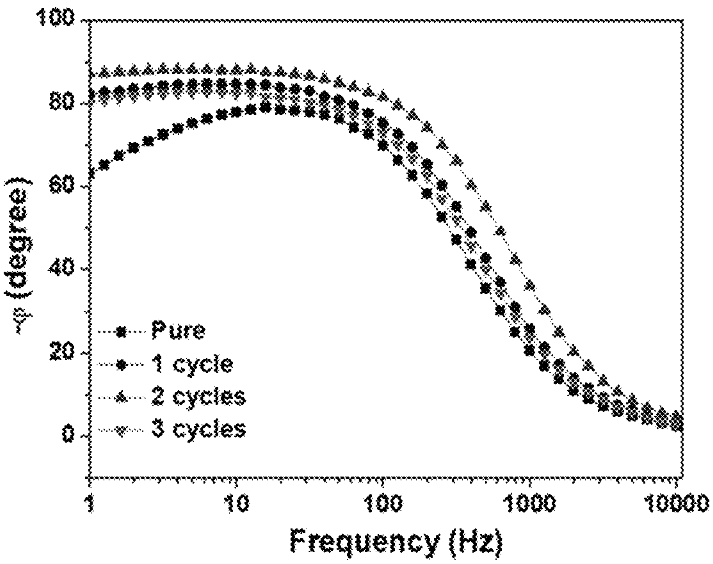

[Fig. 12]
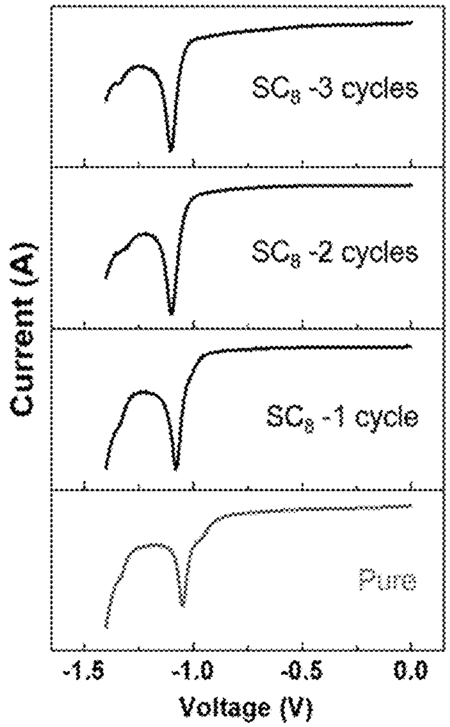
[Fig. 13]
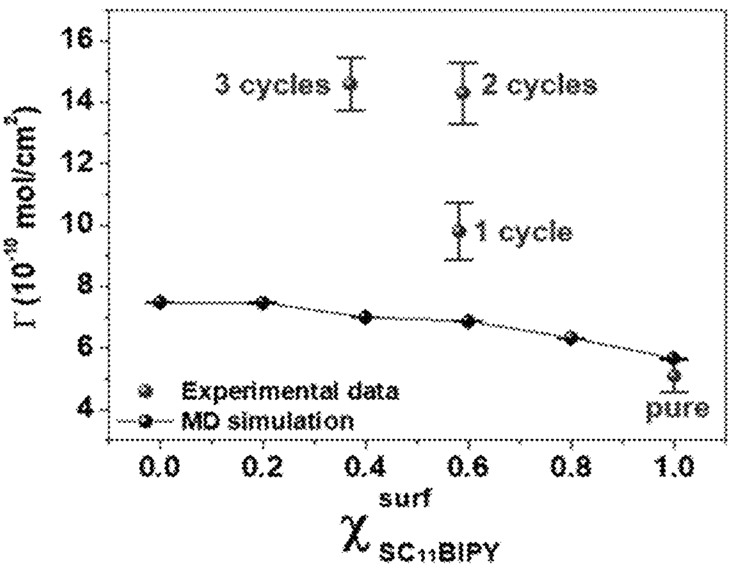

[Fig. 14]
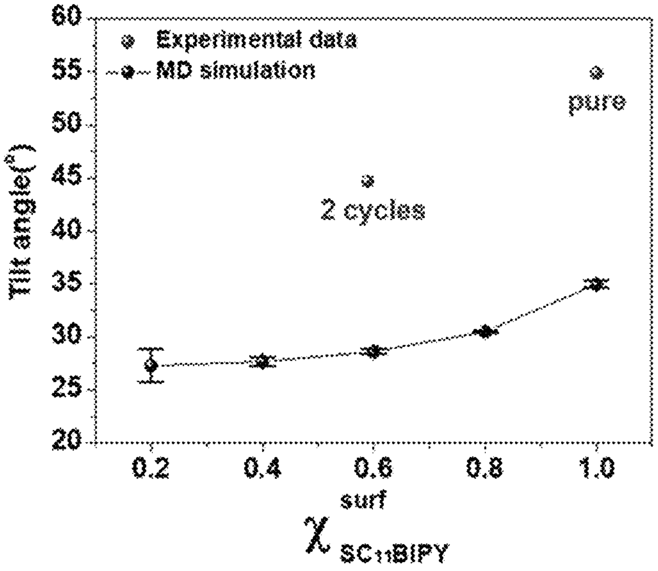

[Fig. 15]
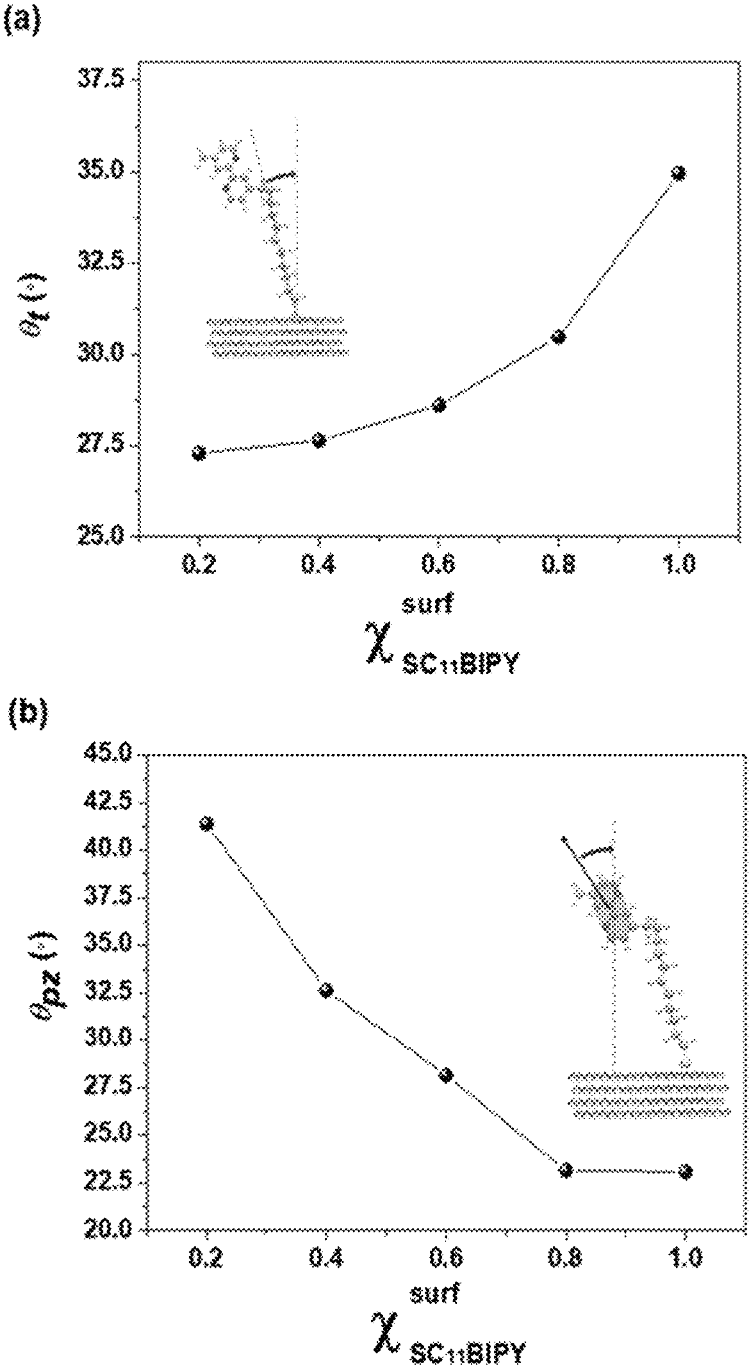

[Fig. 16]
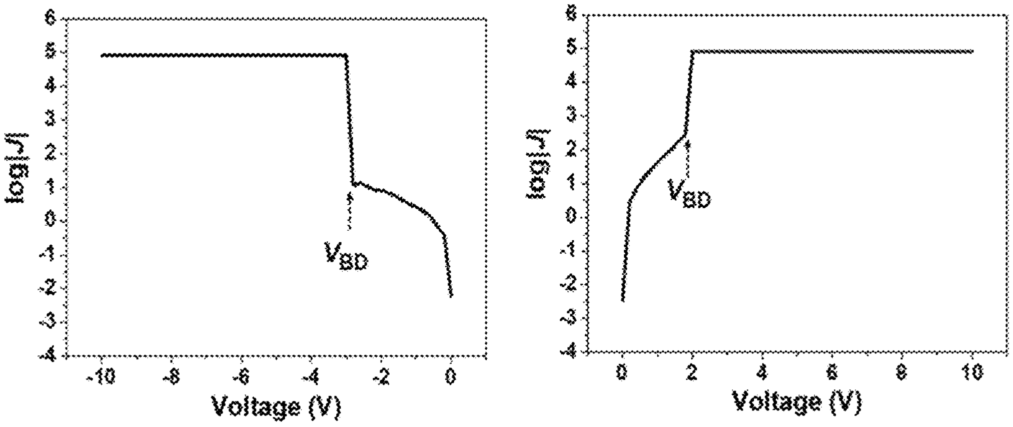
[Fig. 17]
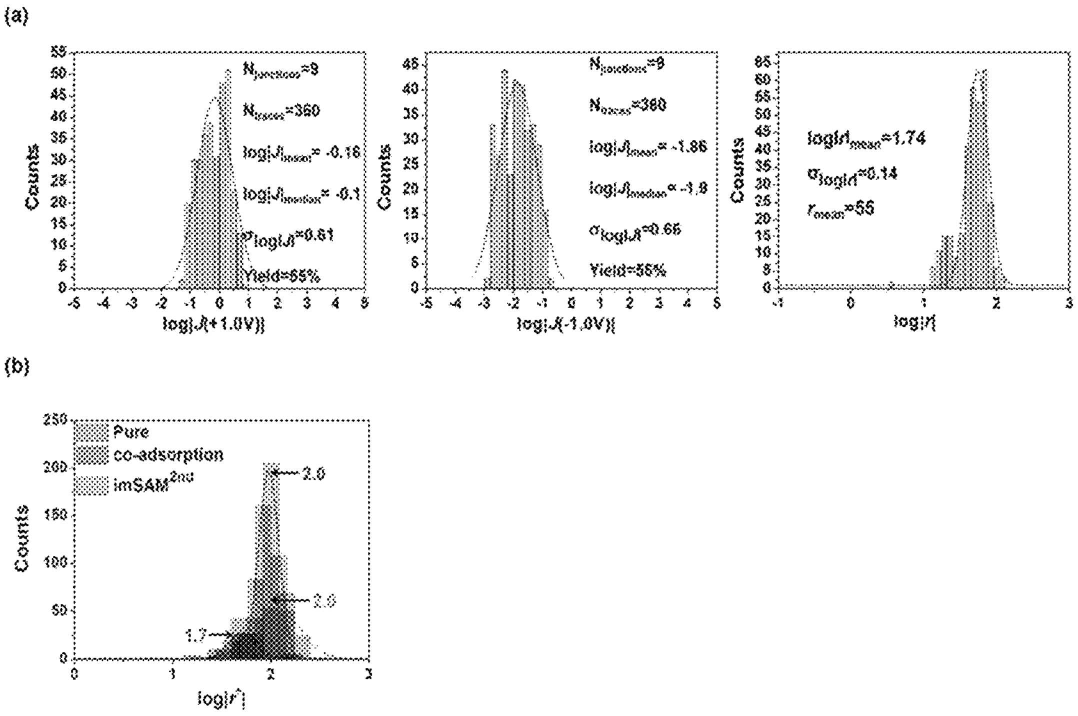

[Fig. 18]
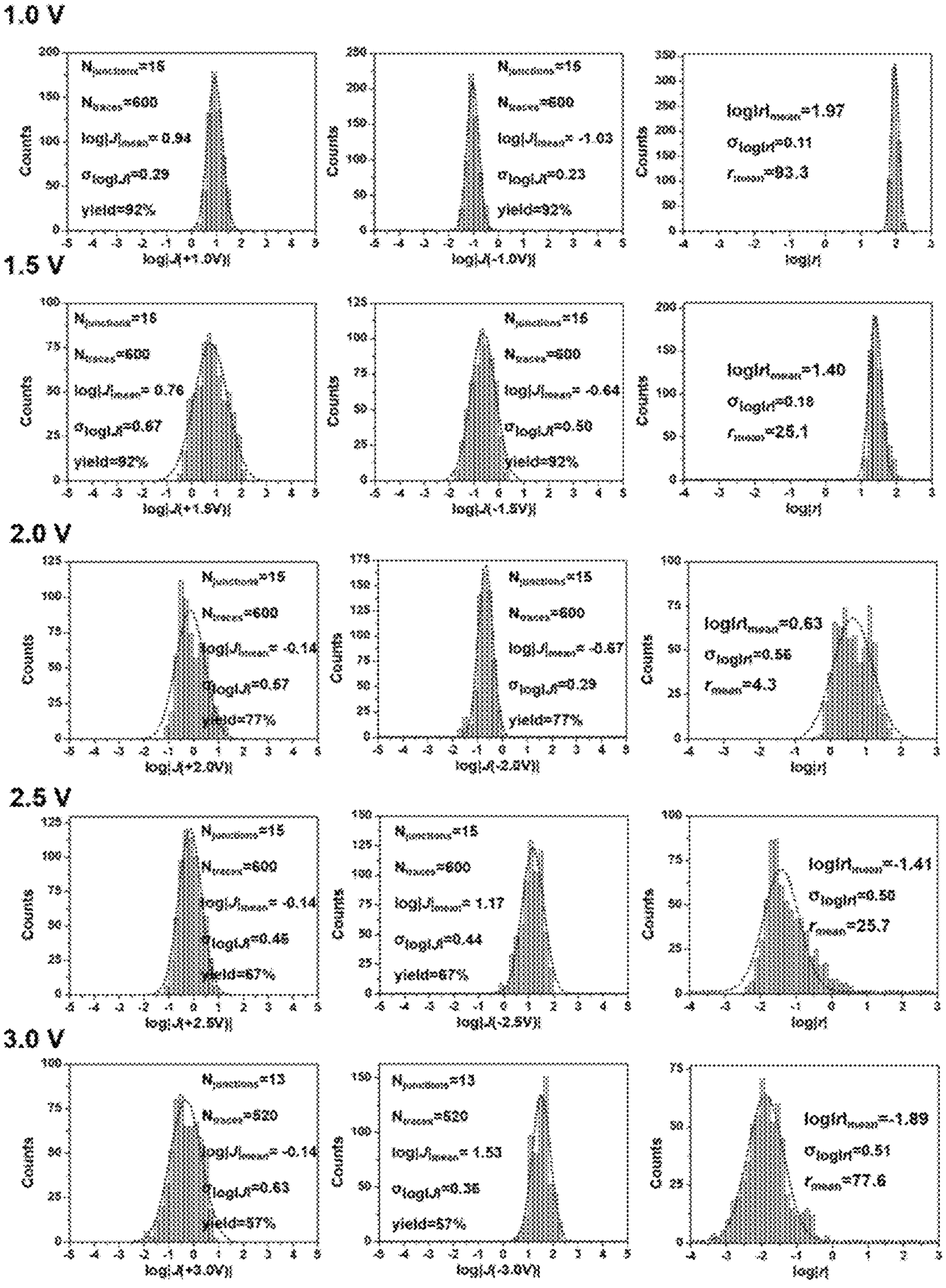

INTERSTITIALLY MIXED SELF-ASSEMBLED MONOLAYERS AND METHOD OF MANUFACTURING THE SAME BY RESEM

CROSS-REFERENCE TO RELATED APPLICATIONS

This application claims the benefit under 35 USC 119 (a) of Korean Patent Application No. 10-2022-0025869, filed with the Korean Intellectual Property Office on Feb. 28, 2022, the disclosure of which is incorporated herein by reference in its entirety.

TECHNICAL FIELD

The present invention relates to an interstitially mixed self-assembled monolayer (ImSAM) and a method of manufacturing the same by ReSEM and more specifically, to an interstitially mixed self-assembled monolayer (ImSAM) that can be manufactured very easily using a novel approach of manufacturing supramolecular alloys called "repeated surface exchange of molecules (ReSEM)", maintain chemical functional groups exposed to the surface of conventional thin films and selectively improve stability without interfering with performance, and a method of manufacturing the same.

BACKGROUND ART

Self-assembled monolayers (SAMs) are nanomaterials for controlling the surface structure that are widely utilized in a variety of fields such as molecular electronics, biotechnology, diagnostics, and energy engineering. SAMs usually include organic molecules and form extremely thin films of about a few nanometers, thus being readily damaged by external stimuli.

For application of molecular electronics, an external electric field is applied to the SAM, the performance of the device is determined depending on how much external voltage the device can withstand, and the maximum withstand voltage is defined as "breakdown voltage". Generally, in the case of SAMs, driving of the electronic device is tested at around 1.0 V, and a short circuit occurs when a higher voltage is applied. The reason for this problem is that the SAM is very thin and has defects on the surface thereof.

In order to solve this problem, efforts have been made to increase the thickness of the SAM by increasing the length of the molecule, or replace the lower electrode supporting the SAM with another material. These methods require considerable efforts and time for organic synthesis for additional molecular structure changes and may cause changes in the desired performance of the SAM due to structural changes. In addition, when the lower electrode is changed, the surface orientation of the molecules is changed and thus it may be difficult to realize the desired performance.

As such, the SAM is an ultrathin organic self-assembled monolayer having a size of a few nanometers (<3 nm), which inevitably has a defect structure when used to produce a large-area film. These supramolecular defects disadvantageously force performance tests of the SAM to be performed only at low voltages. In fact, the supramolecular defects are usually studied only at about 1.0 V of a breakdown voltage ($V_{BD}$) in conventional molecular electronics studies, which is a major obstacle.

DETAILED DESCRIPTION OF THE INVENTION

Problems to be Solved by the Invention

Therefore, the present invention has been made in view of the above problems, and it is one object of the present invention to develop and provide an SAM capable of withstanding unprecedentedly high voltages.

It is another object of the present invention to provide a SAM capable of selectively improving only stability while maintaining the performance of the prior art and a novel method of manufacturing a SAM by introducing an inorganic metal alloy into the SAM.

Means for Solving the Problems

In accordance with the present invention, the above and other objects can be accomplished by the provision of a mixed self-assembled monolayer including a plurality of matrix molecules arranged in parallel adjacent to one another and reinforcement molecules packed between the plurality of matrix molecules.

According to an embodiment of the present invention, the matrix molecule may be represented by the following [Formula 1] and the reinforcement molecule may be represented by the following [Formula 2].

$$HS-(C_nH_{2n+1})-\text{head group} \quad \text{[Formula 1]}$$

$$HS-(C_mH_{2m+1}) \quad \text{[Formula 2]}$$

wherein the head group is selected from a substituted or unsubstituted C3-C20 cycloalkyl group, a substituted or unsubstituted C6-C20 aryl group, and a substituted or unsubstituted C2-C30 heteroaryl group.

In addition, the head group may have a substituted structure that is bulkier than an alkane chain and may be any one of various groups such as cycloalkyl, aryl and heteroaryl groups. In an embodiment of the present invention, the head group may be a substituted or unsubstituted bipyridyl group.

n and m are each an integer from 1 to 50, with the proviso that n>m.

In an embodiment of the present invention, the matrix molecule represented by [Formula 1] may be HS—$(C_{11}H_{23})$-head group, and the reinforcement molecule represented by [Formula 2] may be HS—$(C_8H_{17})$.

In another aspect of the present invention, provided is a method of manufacturing a mixed self-assembled monolayer using a repeated surface exchange of molecules, the method including, (i) forming a self-assembled monolayer (SAM) including a matrix molecule represented by the following [Formula 1] on a substrate using the matrix molecule;

$$HS-(C_nH_{2n+1})-\text{head group} \quad \text{[Formula 1]}$$

(ii) immersing the SAM formed in step (i) in a reinforcement molecule solution represented by the following [Formula 2] to induce a substitution reaction in the surface thereby to form an intermediate mixed self-assembled monolayer (intermediate mixed SAM), $$HS-(C_mH_{2m+1}) \quad \text{[Formula 2]}$$

(iii) immersing the intermediate mixed SAM formed in step (ii) in a matrix molecule solution again to form an interstitial mixed SAM; and (iv) repeating steps (ii) to (iii) n times to induce repeated surface exchange of molecules (n ReSEM cycles) thereby forming an interstitially mixed self-assembled monolayer with minimized supramolecular defects, wherein n is an integer of 2 or more, wherein the head group is selected from a substituted or unsubstituted C3-C20 cycloalkyl group, a substituted or unsubstituted C6-C20 aryl group, and a substituted or unsubstituted C2-C30 heteroaryl group, and n and m are each an integer from 1 to 50, with the proviso that n>m.

The substrate may be a flat template-stripped metal chip. In an embodiment of the present invention, the substrate may be $Au^{TS}$, $Ag^{TS}$, $Pt^{TS}$, or the like.

In another aspect of the present invention, provided is a molecular electronic device including the mixed self-assembled monolayer manufactured by the method described above.

The molecular electronic device according to the present invention includes an upper electrode, a lower electrode facing the upper electrode, and a molecular layer formed on the lower electrode, wherein the molecular layer is the mixed self-assembled monolayer manufactured by the method according to the present invention.

In addition, the upper electrode may be an electrode based on a liquid metal eutectic gallium-indium (EGaIn) alloy.

In an embodiment of the present invention, the molecular electronic device may have a breakdown voltage ($V_{BD}$) of $|2.0\ V|$ to $|4.6\ V|$.

Effects of the Invention

Electrical breakdown is a critical problem in electronics. In molecular electronics, ultrathin molecular monolayers become more problematic because they limit device performance due to delicate and defective structures and intrinsically low breakdown voltages thereof.

Therefore, the interstitially mixed self-assembled monolayers (imSAMs) according to the present invention can remarkably improve electrical stability of molecular-scale electronic devices without deterioration in functions and reliability, withstand a high voltage, and exhibit better stability than a single SAM while maintaining the performance of the prior art, thereby solving the above problems in molecular electronics.

In addition, the SAM of sterically bulky matrix ($SC_{11}BIPY$ rectifier) molecule is diluted with a skinny reinforcement ($SC_n$) molecule via the new approach, so-called "repeated surface exchange of molecules (ReSEM)". As a result, the gaps between matrix molecules are filled with reinforcement molecules, thereby very easily manufacturing interstitially mixed SAMs (imSAMs) that generate significantly improved breakdown voltages that are inaccessible to conventional pure or mixed SAMs.

As a result, the present invention can overcome the disadvantages of instability of SAMs and improve functions thereof, thus being useful for a variety of technical fields using SAM, especially electronics, organic light-emitting displays (OLEDs), solar cells, sensors, heterogeneous catalysts, frictional electricity, cell growth surfaces, and heat transfer control films.

Although specific configurations of the present invention have been described in detail, those skilled in the art will appreciate that this detailed description is provided as preferred embodiments for illustrative purposes and should not be construed as limiting the scope of the present invention. Therefore, the substantial scope of the present invention is defined by the accompanying filed claims and equivalents thereto.

BRIEF DESCRIPTION OF THE DRAWINGS

The above and other objects, features, and other advantages of the present invention will be more clearly understood from the following detailed description taken in conjunction with the accompanying drawings, in which:

(a) to (d) of FIG. 1 are diagrams illustrating the configuration of an interstitially mixed self-assembled monolayer (ImSAM) according to the present invention, more particularly, (a) of FIG. 1 is a schematic diagram illustrating the formation of an interstitially mixed self-assembled monolayer in a single pure SAM, (b) of FIG. 1 illustrates the chemical structure of a matrix molecule ($HSC_{11}BIPY$) and a reinforcement molecule (non-rectifying n-alkanethiol, $SC_n$) used in an embodiment of the present invention, (c) of FIG. 1 illustrates a step-by-step manufacturing process of a molecular diode using ReSEM, and (d) of FIG. 1 illustrates the conceptual similarity between an inorganic interstitial metal alloy and the method according to the present invention;

(a) to (f) of FIG. 2 illustrate the characterization of the interstitially mixed self-assembled monolayer (ImSAM) according to the present invention, more particular, (a) of FIG. 2 illustrates the behavior of the $V_{BD}$ at +V as a function of the number of ReSEM cycles for SAM of $SC_{11}BIPY$ and $SC_8$ on $Au^{TS}$, (b) of FIG. 2 illustrates the behavior of surface mole fraction of $SC_{11}BIPY$ $$(X^{surf}_{SC11BIPY})$$

determined by spectra, (c) and (d) of FIG. 2 illustrate static contact angle and % EAS analysis data as a function of the number of ReSEM cycles, respectively, (e) of FIG. 2 illustrates the correlation between bode phase at 1 Hz and $V_{BD}$ and the number of ReSEM cycles, and (f) of FIG. 2 illustrates the plots of surface coverage ($\Gamma$, mol/cm$^2$) as a function of number of ReSEM cycles;

FIG. 3 illustrates J (V) traces and histograms of breakdown voltage ($V_{BD}$) for pure $SC_{11}BIPY$ SAM and a series of mixed SAMs formed with $HSC_{11}IBIPY$ and $HSC_8$ on $Au^{TS}$ via different numbers of ReSEM cycles;

FIG. 4 illustrates J (V) traces and histograms of breakdown voltage ($V_{BD}$) for mixed SAMs formed with $SC_{11}BIPY$ and $SC_8$ on $Ag^{TS}$ and $Pt^{TS}$ via two ReSEM cycles;

FIG. 5 illustrates high resolution S2p X-ray photoelectron spectra for a series of mixed SAMs formed with $HSC_{11}BIPY$ and $HSC_8$ on $Au^{TS}$ via different numbers of ReSEM cycles, wherein all the spectra show a single type of spin-orbit coupled doublets (~162 and ~163 eV for $2_{p3/2}$ and $2_{p1/2}$, respectively), indicative of chemisorbed sulfur;

FIG. 6 illustrates high resolution N1s X-ray photoelectron spectra for a series of mixed SAMs formed with $HSC_{11}BIPY$ and $HSC_8$ on $Au^{TS}$ via different numbers of ReSEM cycles;

FIG. 7 illustrates plots of static water contact angle for a series of mixed SAMs formed with $HSC_{11}BIPY$ and $HSC_8$ on $Au^{TS}$ via different numbers of ReSEM cycles, wherein data were averaged from eight separate measurements;

FIG. 8 illustrates plots of dynamic water contact angle (Dcosq) for a series of mixed SAMs formed with $HSC_{11}BIPY$ and $HSC_8$ on $Au^{TS}$ via different numbers of ReSEM cycles;

(a) and (b) of FIG. 9 illustrate AFM analysis of pure $SC_{11}BIPY$ SAM and $imSAM^{2nd}$ on $Au^{TS}$, respectively;

FIG. 10 shows the result of % EAS analysis for pure $SC_{11}BIPY$ SAM and a series of mixed SAMs formed with $HSC_{11}BIPY$ and $HSC_8$ on $Au^{TS}$ via different numbers of ReSEM cycles;

FIG. 11 illustrates bode phase plots of pure $SC_{11}BIPY$ SAM and mixed SAMs formed with $HSC_{11}BIPY$ and $HSC_8$ on $Au^{TS}$ via different numbers of ReSEM cycles, wherein the data were averaged from seven separate measurements;

FIG. 12 illustrates linear voltammograms for reductive desorption of pure SC11BIPY SAM and mixed SAMs formed with $HSC_{11}BIPY$ and $HSC_8$ on $Au^{TS}$ via different numbers of ReSEM cycles;

FIG. 13 illustrates plots of surface coverage (I, mol/cm$^2$) determined by experiments and simulations for mixed SAMs formed with $HSC_{11}BIPY$ and $HSC_8$ on $Au^{TS}$;

FIG. 14 illustrates plots of tilt angle of alkyl backbone determined by experiments (with NEXAFS) and simulations for mixed SAMs formed with $HSC_{11}BIPY$ and $HSC_8$ on $Au^{TS}$;

(a) and (b) of FIG. 15 illustrate MD-simulated tilt angle, $\theta_1$, of the hydrocarbon backbone of $SC_{11}BIPY$, and tilt angle, $\theta_{pz}$, of the BIPY plane relative to the surface normal for imSAMs, respectively;

FIG. 16 illustrates representative breakdown J-V curves in forward and reverse biases for $imSAM^{2nd}$ SAM;

(a) and (b) of FIG. 17 illustrate histograms of log|J(V)| and log|r| values for mixed SAM formed with $HSC_{11}BIPY$ and $HSC_8$ on $Au^{TS}$ via co-adsorption, and histograms of log|r| value for the pure $SC_{11}BIPY$ SAM, mixed SAM formed via co-adsorption, and $imSAM^{2nd}$, respectively; and FIG. 18 illustrates histograms of log|J(V)| and log|r| values for $imSAM^{2nd}$ on $Au^{TS}$ as a function of external bias voltage.

DETAILED DESCRIPTION OF THE INVENTION

Hereinafter, the present invention will be described in more detail.

The present invention relates to a novel SAM and a method of manufacturing the same to remove supramolecular defects and more particularly, to a mixed SAM having a novel concept supramolecular alloy structure that can withstand high voltages, maintain the performance and superior stability of the prior art, and exhibit better stability than a single SAM using repeated surface exchange of molecules (ReSEM).

Any molecule may be used as the matrix molecule in the interstitial mixed self-assembled monolayer according to the present invention as long as it has a bulky head group and a thin alkane backbone.

According to one embodiment of the present invention, this matrix molecule refers to an organic molecule having a C11 alkyl chain as a backbone and 2,2'-bipyridine (BIPY) as an end group, which is called "$HSC_{11}BIPY$".

In addition, any molecule may be used as the reinforcement molecule as long as it has the same alkane backbone as the matrix molecule and is shorter than the matrix molecule. In an embodiment of the present invention, the reinforcement molecule may be $SC_8$.

A method of manufacturing an interstitially mixed self-assembled monolayer (ImSAM) using (ReSEM) according to the present invention will be described with reference to an embodiment of the present invention shown in (c) of FIG. 1 as follows.

The method includes:

(i) introducing $HSC_{11}BIPY$ molecules onto the surface of a template-stripped gold ($Au^{TS}$) designed to have a flat surface to form a SAM;

(ii) immersing the SAM formed in step (i) in an $HSC_8$ solution to induce a substitution reaction on the surface thereof to form an intermediate mixed SAM;

(iii) immersing the intermediate mixed SAM formed in step (ii) in an $HSC_{11}BIPY$ solution again to form an interstitial mixed SAM with enhanced packing, which is referred to as "1 ReSEM cycle"; and (iv) infinitely repeating steps (ii) to (iii) to form an interstitially mixed self-assembled monolayer with minimized supramolecular defects (n ReSEM cycles, n=2, 3, 4 . . . ).

The interstitially mixed self-assembled monolayer ((a) of FIG. 1) formed by ReSEM according to an embodiment of the present invention will be described again as follows and the following experimental example proves that the interstitially mixed self-assembled monolayer exhibits significantly improved electrical stability compared to a single SAM.

The present invention focuses on $HSC_{11}BIPY$ as the matrix and reinforcement molecules and $HSC_8$ (1-octanethiol) as a non-rectifying diluent ((b) of FIG. 1). The interstitially mixed self-assembled monolayer having a sterically bulky matrix molecular structure ($HSC_{11}BIPY$ rectifier) and a skinny reinforcement molecule ($HSC_8$) is formed using a novel method called "repeated surface exchange of molecules (ReSEM)" ((c) of FIG. 1). Combined studies of experiments and simulations reveal that the ReSEM causes skinny/short $SC_8$ molecules to fill interstices between bulky $SC_{11}BIPY$ molecules, thus minimizing defects within monolayers ((d) of FIG. 1), resulting in interstitially mixed SAMs (denoted as "imSAMs"). The imSAMs withstand remarkably high volage ranges (up to ±3.3 V) that are inaccessible by traditional single-component or mixed SAMs, while maintaining high yields (>90%) of working devices without appreciable loss of desired function (representatively, rectification). The unprecedentedly robust structure of imSAM allows for examination of molecular rectification in a wide voltage range, as a proof-of-concept. Unexpectedly, disappearance and inversion of rectification were found upon the increase of external voltage.

The ImSAM according to the present invention may unleash the potential to overcome the instability problem in SAMs and unveil new functionalities in molecular electronics and other related areas.

Hereinafter, the present invention will be described in more detail with reference to preferred examples. However, these examples are merely provided for illustration of the present invention and it will be apparent to those skilled in the art that these examples should not be construed as limiting the scope of the present invention.

Test Method

Matrix Molecule and Reinforcement Molecule $HSC_{11}BIPY$ was synthesized in accordance with the synthetic steps reported in the literature (Yoon, H. J. et al. Rectification in Tunneling Junctions: 2,2'-bipyridyl-terminated n-alkanethiolates. *J. Am. Chem. Soc.* 136, 17155-17162, 2014) and $HSC_8$ (≥95%) was purchased from a commercial company.

Construction and Design of ReSEM Method

Mixed SAMs can be formed by co-adsorption, exchange or sequential adsorption methods. The present invention focuses on the exchange method, which permits one to circumvent the problem of phase segregation. At its conception, the ReSEM approach is inspired by the chemistry of interstitial metal alloys (FIGS. 1A and 1D) wherein the difference in relative size between matrix and reinforcement elements and energy of each element determine the structure and stability of the mix. When the matrix molecule consists of a skinny alkane backbone and a bulky head group (like many of functional molecules in molecular electronics; $SC_{11}BIPY$ in an embodiment of the present invention), interstices between the alkane backbones can be further occupied by another molecular species that fits the voids.

In addition, in consideration of the dynamic process of adsorption in thiol-gold bonding, subsequent exposure of molecular assembly to individual solutions containing each of the constituents would offer the opportunity to create highly robust, interstitial mixed monolayers ((d) of FIG. 1), the organic monolayer version of interstitial alloy, which provides great electrical stability. The following (c) of FIG. 1 illustrates the ReSEM process according to the present invention, which includes subsequent exposure of as-prepared pure SAM of matrix molecule to solutions containing each of reinforcement and matrix compounds; n cycles of ReSEM process affords $imSAM^{nth}$ wherein n=1, 2, 3 . . . ).

Formation of SAM Using ReSEM

As shown in (c) of FIG. 1, the ReSEM method includes the following steps.

(i) A freshly prepared ultraflat template-stripped gold ($Au^{TS}$) chip was immersed in a degassed ethanol solution containing $HSC_{11}BIPY$. After incubation under $N_2$ atmosphere at room temperature for 3 hours, the SAM-bound $Au^{TS}$ chip was thoroughly rinsed with ethanol.

(ii) Then, the resulting mixed SAM was immersed in a 1 mM ethanol solution containing $HSC_8$. After incubation under $N_2$ atmosphere at room temperature for 3 hours, the SAM was rinsed with ethanol.

(iii) this step was repeated with an ethanol solution of 1 mM $HSC^{11}BIPY$ for 18 hours.

The last two steps are defined as one cycle in the ReSEM process. The cycle is repeated until $V_{BD}$ reaches a plateau and the value of $r^+$ is maximized or similar to that of pure $SC_{11}BIPY$ SAM.

Surface Characterization

Breakdown voltage measurement and data analysis thereof, contact angle measurement, XPS, % EAS, EIS, reductive desorption, AFM, NEXAFS and ellipsometry were performed.

Breakdown Voltage Measurement

In a typical experiment, a junction with the structure, $Au^{TS}/SAM//Ga_2O_3/EGaIn$ ("/" and "//" correspond to covalent and van der Waals contacts, respectively), was formed, and three J-V traces were measured at ±0.50 V to identify the contact. Then, a voltage sweep from zero to either of sufficiently high +V or −V (here, +10.0 V and −10.0 V) with a step size of 0.2 V was applied to the junction until a sharp increase in J occurred by several orders of magnitude and current (I, A) reached the maximum set value of an electrometer, 105 mA. FIG. 16 shows a representative measurement and determination of $V_{BD}$.

Improvement in $V_{BD}$ by ReSEM $V_{BD}$ was measured on $SC_{11}BIPY$ SAM diluted with $SC_8$ using the liquid metal technique based on eutectic Ga—In (EGaIn) to evaluate the effect of the ReSEM process on $V_{BD}$. The EGaIn technique permits convenient and rapid formation of van der Waals (vdW) top-contacts over delicate organic thin films in a noninvasive manner. Continuous voltage sweep was applied to junctions from zero to a sufficiently high voltage, ±10.0 V, until the junction shorted.

As can be seen from (a) of FIG. 2, the histograms of $V_{BD}$ values were fit to single gaussian curves that determined mean values ($\mu^{V_{BD}}$). The value of $\mu^{V_{BD}}$ for the pure $SC_{11}BIPY$ SAM was revealed to be |1.4 V|, and after two ReSEM cycles it remarkably increased up to |3.3 V|, which indicates the most robust structure in the $imSAM^{2nd}$ (see FIGS. 3 and 4 and Table 1). The highest $V_{BD}$ that was reached was |4.6 V|. The statistically proven data elucidate that the ReSEM significantly enhances $V_{BD}$ as compared to the intact pure SAM.

Table 1 below summarizes the electrical properties for pure $SC_8$ and $SC_{11}BIPY$ SAMs and a series of mixed SAMs formed from $HSC_{11}BIPY$ and $HSC_8$ on $Au^{TS}$ through various numbers of ReSEM cycles, while pure $SC_{11}BP$ YSAMs are considered single-component SAMs. In addition, Table 2 below summarizes the electrical properties of mixed SAMs formed from $HSC_{11}BIPY$ and $HSC_8$ in $Ag^{TS}$ and $Pt^{TS}$ through two ReSEM cycles.

Table 2 below summarizes the electrical properties for mixed SAMs formed from $HSC_{11}BIPY$ and $HSC_8$ on $Au^{TS}$ and $Pt^{TS}$ through two ReSEM cycles.

TABLE 1

| | −V | | | +V | | |
|---|---|---|---|---|---|---|
| | Number of junctions | Number of J-V traces | $\mu^{V_{BD}} \pm \sigma^{V_{BD}}$ | Number of junctions | Number of J-V traces | $\mu^{V_{BD}} \pm \sigma^{V_{BD}}$ |
| Pure $SC_{11}BIPY$ | 32 | 32 | −2.9 ± 0.3 | 35 | 35 | 1.4 ± 0.3 |
| 1 cycle | 30 | 30 | −3.0 ± 0.1 | 46 | 46 | 3.1 ± 0.4 |
| 2 cycles | 29 | 29 | −3.0 ± 0.2 | 40 | 40 | 3.3 ± 0.3 |
| 3 cycles | 20 | 20 | −2.9 ± 0.1 | 21 | 21 | 2.7 ± 0.1 |
| $SC_8$ | 29 | 29 | −2.2 ± 0.1 | 36 | 36 | 0.7 ± 0.2 |

TABLE 2

| | −V | | | +V | | |
|---|---|---|---|---|---|---|
| | Number of junctions | Number of J-V traces | $\mu^{V_{BD}} \pm \sigma^{V_{BD}}$ | Number of junctions | Number of J-V traces | $\mu^{V_{BD}} \pm \sigma^{V_{BD}}$ |
| $Ag^{TS}$ | 14 | 14 | −1.3 ± 0.1 | 22 | 22 | 1.2 ± 0.1 |
| $Pt^{TS}$ | 18 | 18 | −2.5 ± 0.1 | 38 | 38 | 2.5 ± 0.1 |

Structural Characterization of ImSAMs

Adsorption behavior during the ReSEM process was tracked by X-ray photoelectron spectroscopy (XPS). ImSAM showed S2p double signals (FIG. 5) at 161.8 and 162.9 eV for $2p_{3/2}$ and $2p_{1/2}$, respectively, which correspond to well-ordered chemisorbed thiolate species adsorbed on gold. In addition, as can be seen from (b) of FIG. 2, the surface mole fraction $$\left(X_{SC11BIPY}^{surf}\right)$$

determined by the intensity of the N1s (FIG. 6) signal overall decreased with cycle number, demonstrating the dilution of $SC_{11}$BIPYSAM by replacing $SC_{11}$BIPY with $SC_8$. However, the value of $$X_{SC11BIPY}^{surf}$$

did not significantly decrease between the 1st and 2nd cycles (0.58 and 0.59, respectively). Among the ReSEM-treated SAMs, the highest values were recorded for $ImSAM^{2nd}$, which corresponds to the $V_{BD}$ behavior.

In order to prove the enhanced packing of monolayers by ReSEM and interstitially mixed structure, the SAM was characterized using contact angle goniometry, atomic force microscopy (AFM) and wet electrochemical methods (% EAS, percentage of electrochemically active surface area), reductive desorption and electrochemical impedance spectroscopy (EIS). Static and dynamic contact angle measurements provide access to surface structure information (dominant surface exposure groups and degree of structural roughness, respectively).

FIGS. 7 and 8 and Tables 3 and 4 show data of contact angle measurements. As summarized in (c) of FIG. 2, the static contact angle (cos $\theta_s$=0.45-0.51) for the ReSEM-processed SAMs was similar to that (cos $\theta_s$=0.53) of pure $SC_{11}$BIPY SAM, indicating that the surface of ReSEM-processed SAMs was dominated by the BIPY group. The dynamic contact angle (Δ cos θ=0.04-0.07; (FIG. 8) was lower than that of pure $SC_{11}$IBIPY SAM (Δ cos θ=0.2), indicating that ReSEM yielded smoother surfaces than pure SAM. The values of root mean square (rms) roughness for the pure and mixed SAMs determined by AFM were indistinguishable (~0.2 nm; (a) and (b) of FIG. 9).

Table 3 below summarizes measurements of static water contact angles of a series of mixed SAMs formed from $HSC_{11}$BIPY and $HSC_8$ on $Au^{TS}$ through pure $SC_8$, $SC_{11}$BIPY SAMs and various numbers of ReSEM cycles.

Table 4 below summarizes measurements of static water contact angles of a series of mixed SAMs formed from $HSC^{11}$BIPY and $HSC_8$ on $Au^{TS}$ through pure $SC_8$, $SC_{11}$BIPY SAMs and various numbers of ReSEM cycles.

TABLE 3

| | contact angle (θ)[a] |
|---|---|
| Pure SAM | |
| $SC_{11}$BIPY | 59.9 ± 0.5 |
| $HSC_8$ | 97.0 ± 3.5 |
| ReSEM-processed SAM | |
| 1 cycle | 60.1 ± 1.5 |
| 2 cycles | 59.3 ± 1.3 |
| 3 cycles | 63.0 ± 1.7 |

[a]Averaged from eight separate measurements; error range is based on standard deviation.

TABLE 4

| | contact angle (θ)[a] | | |
|---|---|---|---|
| | $\Theta_A{}^a$ | $\Theta_R{}^b$ | $\Delta\Theta^c$ |
| Pure SAM | | | |
| $SC_{11}$BIPY | 64.5 ± 4.5 | 49.7 ± 7.7 | 14.8 ± 2.2 |
| $HSC_8$ | 99.5 ± 1.7 | 91.2 ± 3.8 | 8.2 ± 2.1 |
| ReSEM-processed SAM | | | |
| 1 cycle | 60.8 ± 1.5 | 56.3 ± 1.8 | 4.5 ± 0.3 |
| 2 cycles | 59.0 ± 1.3 | 55.0 ± 1.6 | 4.0 ± 0.3 |
| 3 cycles | 64.4 ± 0.4 | 61.5 ± 4.9 | 2.9 ± 4.5 |

[a]Advancing contact angle
[b]Receding contact angle
[c]Averaged from eight separate measurements; error range is based on standard deviation.

Wet-electrochemical surface analysis is sensitive enough to quantitatively assess defects in SAMs. In % EAS measurements, the ratio of peak reduction currents for a SAM-bound electrode to the corresponding bare electrode was determined for gauging the degree of surface defects. The SAM of two ReSEM cycles exhibited the smallest % EAS value ((d) of FIG. 2)-even smaller than that of the pure $SC_{11}$BIPY SAM by 2.4 times-indicative of a well-packed monolayer (FIG. 10 and Table 5).

Table 5 below summarizes measurements of % EAS data of a series of mixed SAMs formed from $HSC_{11}$BIPY and $HSC_8$ on $Au^{TS}$ through pure $SC_{11}$BIPY SAMs and various numbers of ReSEM cycles.

TABLE 5

| | % EAS[a] |
|---|---|
| Pure SAM | |
| $SC_{11}$BIPY | 2.4 ± 0.2 |
| ReSEM-processed SAM | |
| 1 cycle | 2.1 ± 0.2 |
| 2 cycles | 1.0 ± 0.1 |
| 3 cycles | 2.2 ± 0.1 |

[a]Averaged from six measurements; error range is based on standard deviation.

A similar result was observed in EIS measurements wherein SAM permeability induced by pinhole defects was identified. The defect-free SAM acts as an ideal capacitor and has a phase angle ($—\varphi_{1\ Hz}$)=90° at 1 Hz in the Helmholtz model. The smaller $-\varphi_{1\ Hz}$ value indicates that the density of pinholes in the SAM increases. Upon two cycles of ReSEM, $-\varphi_{1\ Hz}$ increased from 73° to 86°, revealing the enhanced packing quality in the mixed SAM with marginal defects (inset in (e) of FIG. 2). (e) of FIG. 2 shows the overall trend of $-\varphi_{1\ Hz}$ as a function of the number of ReSEM cycles, which corresponded well to the behavior of $V_{BD}$. The local discharge may cause pinholes in SAM, which generates heat and induces breakdown. These results suggest that ReSEM according to the present invention minimizes pinhole defects and improves electrical stability.

Reductive desorption experiments provide critical information about the interstitially mixed structure on surface thereof. Upon ReSEM, the reduction peak was shifted toward positive (see inset in (f) of FIG. 2; see FIG. 12), which indicates that the intermolecular lateral interaction inside the mixed SAM was stronger than that of the pure $SC_{11}$BIPY SAM. The surface coverage ($\Gamma$, mol/cm$^2$) for the ReSEM-processed mixed SAM was higher (by up to three times) than that of the pure SAM, and the mixed SAM of the two cycles was revealed to be most densely packed (see inset in (f) of FIG. 2). Unlike in conventional mixed SAMs, single reductive desorption peak (inset in (f) of FIG. 2) was observed in the cyclic voltammogram of the ReSEM mixed SAM, which indicates the homogeneity in surface structure and strong lateral interaction between the reinforcement and matrix molecules.

Finally, all the surface analysis data in (a) to (f) of FIG. 2 elucidate that the ReSEM yielded imSAMs with more ordered and densely packed structures than the pure SAM and the imSAM$^{2nd}$ resulted in the best system explaining the $V_{BD}$ data.

The invention claimed is:

1. A method of manufacturing a mixed self-assembled monolayer comprising:

(i) forming a self-assembled monolayer (SAM) including a matrix molecule represented by the following [Formula 1] on a substrate using a solution of the matrix molecule;

$$HS-(C_nH_{2n+1})-\text{head group} \qquad \text{[Formula 1]}$$

(ii) immersing the SAM formed in step (i) in a reinforcement molecule solution represented by the following [Formula 2] to induce a substitution reaction on a surface of the substrate thereby to form an intermediate mixed self-assembled monolayer (intermediate mixed SAM);

$$HS-(C_mH_{2m+1}) \qquad \text{[Formula 2]}$$

(iii) immersing the intermediate mixed SAM formed in step (ii) in the solution of the matrix molecule again to form an interstitial mixed SAM; and (iv) repeating steps (ii) to (iii) k times to induce repeated surface exchange of molecules (n ReSEM cycles) thereby forming an interstitially mixed self-assembled monolayer with minimized supramolecular defects, wherein k is an integer of 2 or more, n and m are each an integer from 1 to 50, with the proviso that n>m, and wherein the head group in [Formula 1] is a substituted or unsubstituted bipyridyl group.

2. The method according to claim 1, wherein the substrate is a flat template-stripped metal chip.

3. The method according to claim 1, wherein the matrix molecule represented by [Formula 1] is HS—($C_{11}H_{23}$)-head group and the reinforcement molecule represented by [Formula 2] is HS—($C_8H_{17}$).

* * * * *